(12) United States Patent
Gude

(10) Patent No.: US 7,725,867 B2
(45) Date of Patent: May 25, 2010

(54) GATE-ARRAY OR FIELD PROGRAMMABLE GATE ARRAY

(75) Inventor: Michael Gude, Buchenhoehe 1, Kerpen (DE) 50169

(73) Assignee: Michael Gude

( * ) Notice: Subject to any disclaimer, the term of this patent is extended or adjusted under 35 U.S.C. 154(b) by 614 days.

(21) Appl. No.: 11/099,507

(22) Filed: Apr. 6, 2005

(65) Prior Publication Data

US 2005/0231234 A1 Oct. 20, 2005

(30) Foreign Application Priority Data

Apr. 20, 2004 (DE) ........................ 10 2004 018 976

(51) Int. Cl.
*G06F 17/50* (2006.01)
(52) U.S. Cl. .......................................... 716/16; 716/17
(58) Field of Classification Search .............. 716/15–18
See application file for complete search history.

(56) References Cited

U.S. PATENT DOCUMENTS

| | | | | |
|---|---|---|---|---|
| 6,216,257 B1 * | 4/2001 | Agrawal et al. | ............... | 716/16 |
| 6,839,888 B2 * | 1/2005 | Gupta | ........................ | 716/16 |
| 7,200,837 B2 * | 4/2007 | Stevens | ...................... | 717/114 |
| 7,222,325 B2 * | 5/2007 | LaBerge | ...................... | 716/17 |
| 7,260,794 B2 * | 8/2007 | Butts | ............................ | 716/4 |
| 7,360,196 B1 * | 4/2008 | Perry | .......................... | 716/17 |
| 2004/0133869 A1 * | 7/2004 | Sharma | ...................... | 716/16 |

\* cited by examiner

*Primary Examiner*—Jack Chiang
*Assistant Examiner*—Binh C Tat

(57) ABSTRACT

Some Gate Arrays and in particular Filed Programmable Gate Arrays (FPGAs), realize combinatorial logic by utilizing socalled "Look Up Tables" (LUTs). Unfortunaltely the circuit expenditure for a LUT is exponentially increasing with the number of inputs. The invention overcomes this problem by using a set of gates as AND, NAND, OR, NOR, XOR, XNOR, AND/OR combination gate, AND/NOR combination gate, OR/AND combination gate, OR/NAND combination gate, identity comparator between two vectors, multiplexer and adder.

In addition, conventional GAs and FPGAs utilize routing structures and channels that allow a so-called Manhattan routing. This has the disadvantage that the signal delay on such a connection is highly dependent on the number of serially linked sections. Consequently, the delay time fluctuates significantly on different connections. The invention overcomes this problem by using a X/Y routing structure with a fixed number of connection points and a fixed local routing.

6 Claims, 5 Drawing Sheets

X/Y routing structure (connection from the upper left to the lower right highlighted)

○ Programmable Switch
CPE Programmable Logic Element

Expansion of a Look Up Table (LUT) by one input

Expansion of a gate by one input, namely on the example of an AND gate

Possible set of adjustable boolean operations for a logic element.

X/Y routing structure (connection from the upper left to the lower right highlighted)

○ Programmable Switch

CPE Programmable Logic Element

Local routing structure

CPE   Programmable Logic Element

GATE-ARRAY OR FIELD PROGRAMMABLE GATE ARRAY

FIELD OF THE INVENTION

The invention covers the field of chip design, especially digital Gate Arrays. These are integrated circuits comprising a big number of identical circuits which are connected to a dedicated functionality by some layers of wire connections or by configurable connections.

BACKGROUND

Gate-Arrays (GAs) or Field Programmable Gate Arrays (FPGAs) are integrated circuits that are characterized in that a plurality of identical transistors or programmable logic elements is arranged on a chip such that an arbitrary circuit, in most instances a digital circuit, can be realized with only a few wiring levels or configurable connections, respectively.

GAs are wired in accordance with the specific application in the last phase of the semiconductor production process; FPGAs are correspondingly programmed by the user in order to realize their configuration in accordance with the circuit to be implemented.

FPGAs, in particular, realize a combinatorial logic in accordance with the state of the art by utilizing so-called "Look Up Tables" (LUTs). These are ROMs or multiplexers that deliver a certain boolean value for each possible combination of the input values (applied to the address inputs or selection inputs). The advantage of these LUTs is that they make it possible to realize any arbitrary boolean function of the I inputs. The total number of boolean functions (operations) for I inputs is:

$2^{(2^I)}$ (in words: 2 to (2 to I)).

This correlation descriptively results from a truth table. At I input variables, this truth table has $Z=2^I$ lines. Each line may contain the output value "0" or "1" such that any boolean operation is uniquely defined by a binary number with Z digits. Consequently, the total number of boolean operations is $2^Z$.

Most important the circuit expenditure for a LUT is not linearly proportional to the number of inputs. In the realization in the form of a ROM as well as in the realization in the form of a multiplexer, the expenditure approximately doubles for each additional input, i.e., the circuit expenditure increases exponentially with the number of inputs (FIG. 1).

This is the reason why existing FPGAs only utilize LUTs with no more than 6 inputs. In most instances, LUTs with only 4 inputs are utilized.

In addition, conventional GAs and FPGAs utilize routing structures and channels that allow a so-called Manhattan routing. This model was adopted from a city with streets that are arranged in a grid-shaped pattern and produces connections by linking smaller sections. This solution has the disadvantage that the signal delay on such a connection is highly dependent on the number of serially linked sections. Consequently, the delay time fluctuates significantly on different connections. This is fatal, in particular, for clock lines because the clock skew may increase to such a degree that the circuit function is no longer ensured.

SUMMARY OF THE INVENTION

The present invention is based on the objective of eliminating the disadvantage of exponentially increasing expenditure for combinatorial boolean functions realized as LUTs and the disadvantage of very undefined and unfavorable routing delays.

BRIEF DESCRIPTION OF THE DRAWINGS

The following characteristics of the invention are elucidated in FIGS. 1-5.

DETAILED DESCRIPTION OF THE INVENTION

According to the invention, the exponentially increasing expenditure for a combinatorial logic is eliminated by utilizing configurable logic elements that can be adjusted between different boolean operations in order to realize the combinatorial logic, wherein the number of these operations M is smaller than the total number of the maximum boolean operations possible for I inputs.

As described above, the total number of possible boolean operations for I inputs is:

$2^{(2^I)}$

Figure 3:
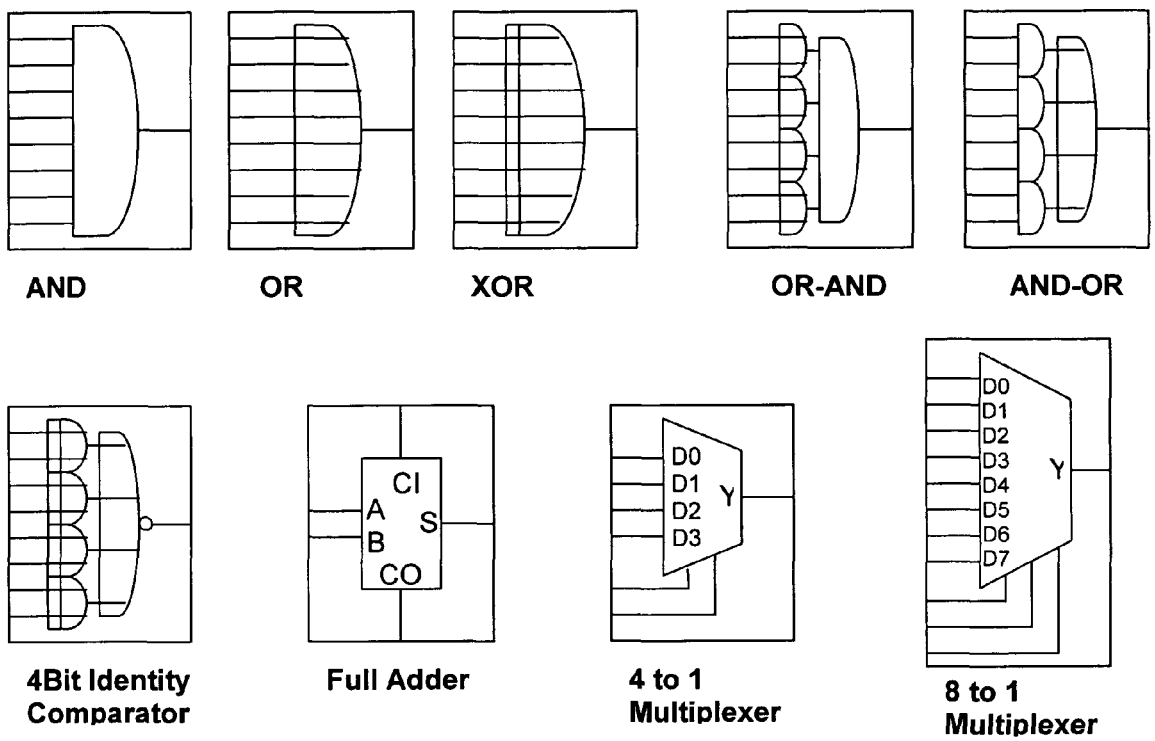
FIG. 3
Possible set of adjustable boolean operations for a logic element.

Only part of the possible boolean functions is now implemented. This makes it possible, for example, to realize any arbitrary boolean function with a circuit consisting of NAND gates only. According to the present invention, it is possible to change over between several selected boolean operations utilized (FIG. 3).

In this respect, it is advantageous, in particular, for the subsequent routing to utilize operations that are fully or partially symmetric, i.e., inputs can be interchanged without altering the boolean function. Although LUTs according to the state of the art can also fulfill this function if a corresponding reconfiguration is carried out in dependence on the input occupancy, it is preferred to utilize boolean functions that are inherently symmetric because no reconfiguration is required in this case.

Typical fully symmetric functions are AND, OR, NAND, NOR, XOR, XNOR. In this case, the result is not dependent on the input occupancy at all, i.e., any input can be interchanged with any other input without altering the boolean function. Although all inputs cannot be arbitrarily interchanged in an identity comparator ($Y=(A_0$ xnor $B_0)$ and $(A_1$ xnor $B_1)$ and $(A_2$ xnor $B_2)$ and $(A_3$ xnor $B_3)$ and . . . ), both inputs of the XNOR and the XNORs can be respectively interchanged.

Figure 1:
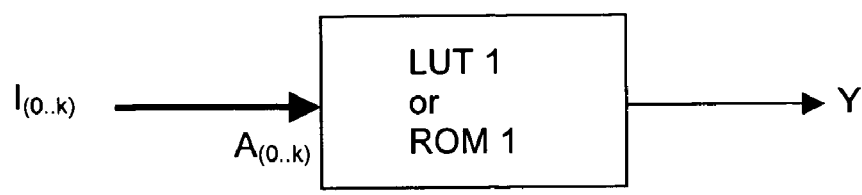
FIG. 1 (prior art)
Expansion of a Look Up Table (LUT) by one input (the expenditure more than doubles for each additional input $I_{k+1}$).
Figure 1:
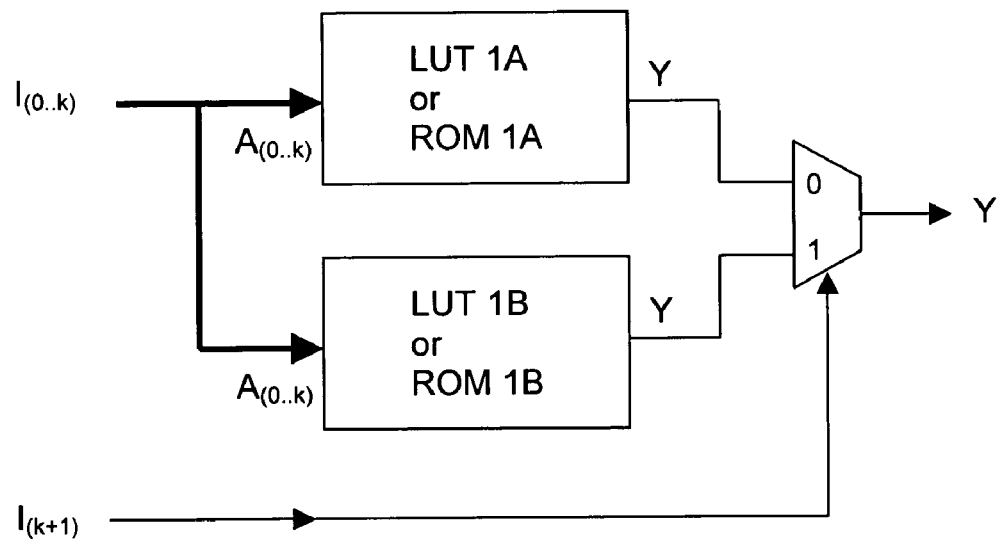
Figure 2:
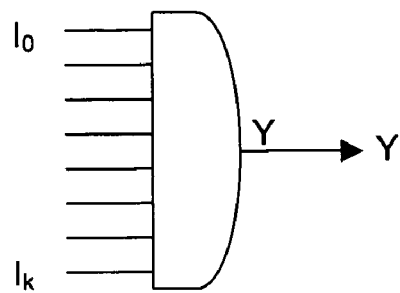
FIG. 2 (prior art)
Expansion of a gate by one input, namely on the example of an AND gate (only one gate with two inputs is required for each additional input $I_{k+1}$).
Figure 2:
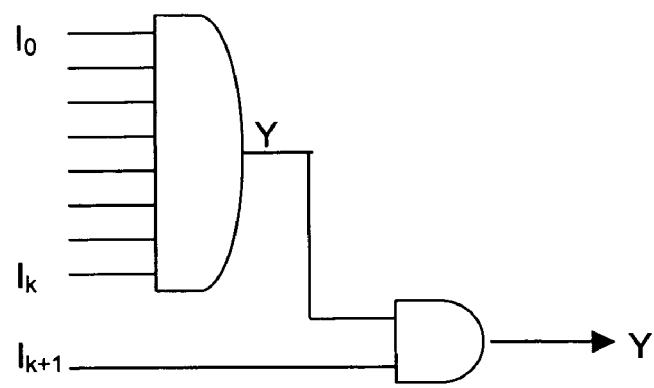

The expenditure of the operations to be utilized in accordance with the invention only increases linearly with the number of inputs used. This is the case with the above-mentioned operations. For example, only an AND or OR with two inputs is respectively required for each additional input of an AND or OR. This means that the expenditure per additional input is constant, i.e., the expenditure increases linearly with the number of inputs (FIG. 2). This is a drastic contrast to LUTs, in which the expenditure increases exponentially (FIG. 1). A LUT with 30 inputs already requires a chip with more than a billion gates!

As mentioned above, it is sensible to design the configurable logic elements in such a way that all or several of the following boolean operations can be adjusted:

AND, NAND, OR, NOR, XOR, XNOR, AND/OR combination gate, AND/NOR combination gate, OR/AND combination gate, OR/NAND combination gate, identity comparator between two vectors, multiplexer and adder (FIG. 3).

If multiplexers are implemented in addition to the gates, the utilization of an 8-to-1 multiplexer with arbitrary interface connection of the data inputs makes it possible to realize the same function as that of a LUT with 4 inputs. Arbitrary interface connection of the inputs means that each input can be statically configured to logic "0" or logic "1" or that the input signal can be used in inverted or non-inverted form.

When utilizing a 4-to-1 multiplexer, it is possible to realize a function that could otherwise only be achieved with a LUT with 6 inputs.

Configurable logic elements are utilized for the defined interface connection of unused inputs and for increasing the boolean functionality such that the inputs of the configurable logic elements can be statically configured to logic "0" or logic "1" or that the input signal is forwarded in inverted or non-inverted form. Depending on the boolean function, this makes it possible to gate out unused inputs. It is also possible to realize additional boolean functions. For example, an AND with all inputs inverted is identical to a NOR.

The routing, i.e., the connection between the logic elements on a chip, is subject to additional requirements.

Figure 4:
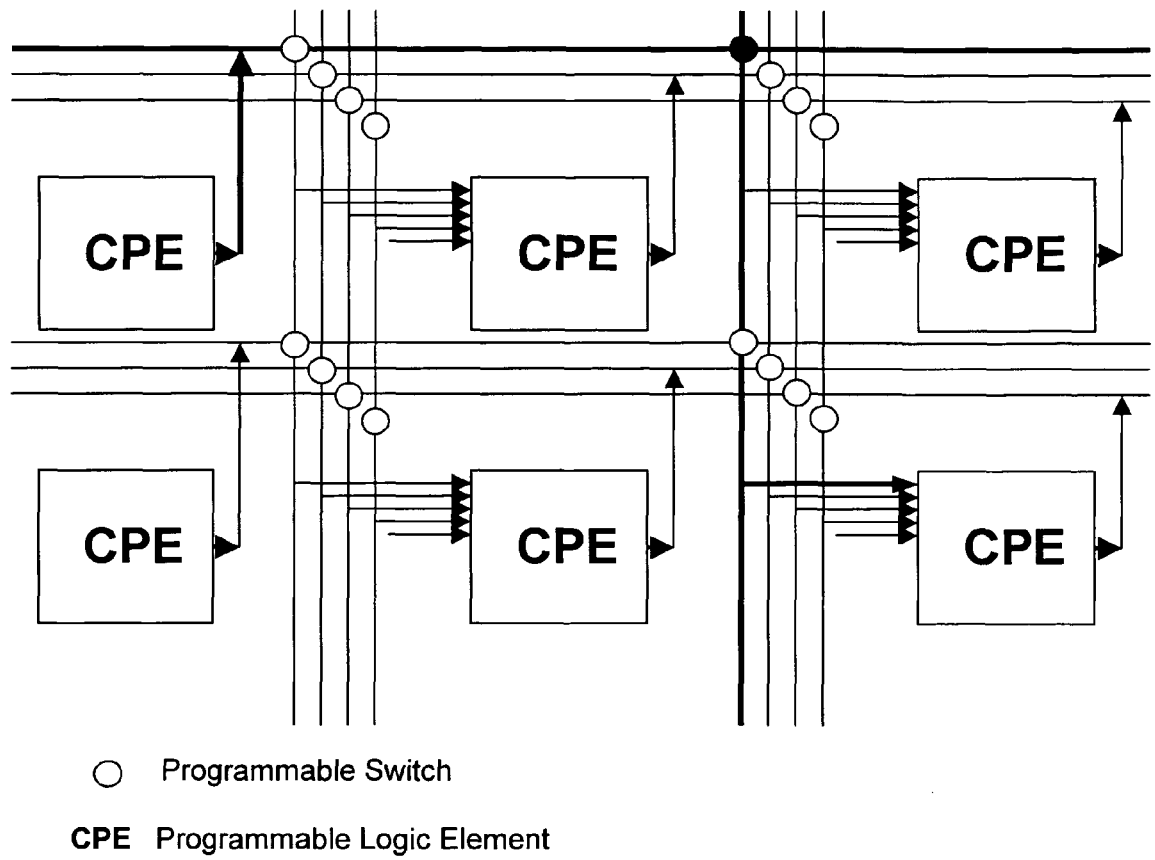
FIG. 4
X/Y routing structure (connection from the upper left to the lower right highlighted)

According to the example shown in FIG. 4, it is advantageous to connect the configurable logic elements by means of a X/Y routing structure such that at least each output of a logic element can be connected to an input of any other logic element. Due to the symmetric structure of the boolean functions used, it is usually not required to provide a connection from one output to a certain input of a logic element in this case.

A constant number of configurable connecting points for each connection is achieved due to this X/Y structure that, however, cannot be used in the form of a single stage over the entire chip due to the driving power and the line delay. However this makes it possible to realize largely constant delay times for arbitrary connections in the X/Y structure. This results in a reduced skew, in particular, for clock connections. Consequently, special clock lines with a low skew can be eliminated for a synchronous logic. Each clock network automatically has a low skew.

Figure 5:
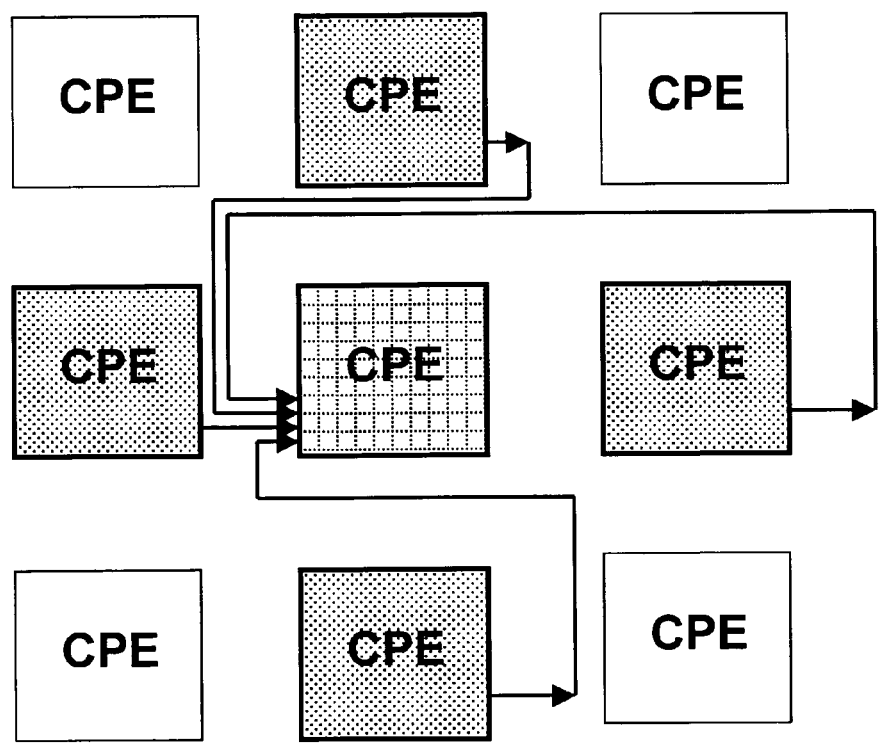
FIG. 5
Local routing structure (outputs of four adjacent CPEs are connected to the inputs of a CPE).

According to the example shown in FIG. 5, the configurable logic elements may also be locally connected via connections that are wired to their inputs, i.e., they may be directly connected to other logic elements located in their close vicinity. Since conventional circuits comprise a large number of local connections, the global X/Y routing resources can be significantly alleviated due to this measure.

In addition, these connections are very fast because they only have a short length on the chip and utilize only one configurable change-over switch.

In addition to these local connections, it is helpful to provide completely hard-wired connections with adjacent logic elements. These connections practically are only utilized for carry paths of adders in FPGAs according to the state of the art. These paths can now be used for the cascading of an arbitrary logic due to the modification according to the invention, by means of which a normal input of a logic element is connected, e.g., to the output of the adjacent logic element.

The invention claimed is:

1. A Gate-Array or FPGA, characterized in
that configurable logic elements with more than 2 inputs are utilized that be switched between different boolean operations in order to realize a combinatorial logic, wherein the number of these operations M is smaller than the total number of possible boolean operations for 1 input;
that operations used are symmetric such that inputs be interchanged without altering the boolean function and that the configurable logic elements are connected by means of a X/Y routing structure in such a way that at least each output of a logic element be connected to only one arbitrary input of any other logic element and that the number of the configurable connecting points to be used for a connection between the logic elements is constant at least in a partial area of the Gate-Array or FPGA such that the delay time is also practically constant on all these paths.

2. The Gate-Array or FPGA according to claim 1, characterized in
that the expenditure of the operations to be utilized only increases linearly with the number of inputs used.

3. The Gate-Array or FPGA according to claim 1, characterized in
that all or several of the following boolean operations can be adjusted: AND, NAND, OR, NOR, XOR, XNOR, AND/OR combination gate, AND/NOR combination gate, OR/AND combination gate, OR/NAND combination gate, identity comparator between two vectors, multiplexer and adder.

4. The Gate-Array or FPGA according to claim 1, characterized in
that the inputs of the logic elements can be statically configured to "0" or "1" or the input signal is forwarded in inverted or non-inverted form.

5. The Gate-Array or FPGA according to claim 1, characterized in
that the configurable logic elements can also be locally connected by means of connections that are wired to their inputs, i.e., the configurable logic elements can be directly connected to other logic element in their close vicinity and these connections are produced via only one configurable switch.

6. The Gate-Array or FPGA according to claim 1, characterized in
that dedicated non-configurable connections between logic elements are provided for the fast operation of a combinatorial logic beyond arithmetical tasks.

* * * * *